(12) United States Patent
Jiang et al.

(10) Patent No.: US 9,219,082 B2
(45) Date of Patent: Dec. 22, 2015

(54) ARRAY SUBSTRATE AND METHOD FOR MANUFACTURING THE SAME, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Qinghua Jiang, Beijing (CN); Xiaohe Li, Beijing (CN); Yong Liu, Beijing (CN); Xianjie Shao, Beijing (CN); Hongmin Li, Beijing (CN)

(73) Assignees: BOE TECHNOLOGY GROUP CO., LTD. (CN); HEFEI BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 14/361,883

(22) PCT Filed: Dec. 19, 2013

(86) PCT No.: PCT/CN2013/089974
§ 371 (c)(1),
(2) Date: May 30, 2014

(87) PCT Pub. No.: WO2015/010431
PCT Pub. Date: Jan. 29, 2015

(65) Prior Publication Data
US 2015/0129882 A1    May 14, 2015

(30) Foreign Application Priority Data

Jul. 23, 2013   (CN) .......................... 2013 1 0311215

(51) Int. Cl.
*H01L 29/04*   (2006.01)
*H01L 27/12*   (2006.01)
(Continued)

(52) U.S. Cl.
CPC ............ *H01L 27/124* (2013.01); *G02F 1/1362* (2013.01); *G02F 1/1368* (2013.01);
(Continued)

(58) Field of Classification Search
CPC . H01L 27/124; H01L 27/1259; H01L 29/786; H01L 29/42384
USPC .............................................. 257/72; 438/48
See application file for complete search history.

(56) References Cited

U.S. PATENT DOCUMENTS

2011/0221475 A1* 9/2011 Koyama et al. ............... 326/120

FOREIGN PATENT DOCUMENTS

| CN | 101707211 | 5/2010 |
|---|---|---|
| CN | 101750826 | 6/2010 |

(Continued)

OTHER PUBLICATIONS

First Office Action issued in corresponding Chinese Application No. 20131031112150 dated May 6, 2015.
International Search Report and Written Opinion issued in corresponding International Application No. PCT/CN2013/089974 dated May 5, 2014.

*Primary Examiner* — Theresa T Doan
(74) *Attorney, Agent, or Firm* — Baker Hostetler LLP

(57) ABSTRACT

The invention relates to an array substrate for a display device and to a method for manufacturing an array substrate comprising a thin-film transistor ("TFT"). An array substrate according to an embodiment of the invention comprises a source electrode, a gate electrode and a drain electrode, wherein the gate electrode is located on a first metal layer, the source electrode and the drain electrode are located on a second metal layer, and in the case that dislocation occurs between the first metal layer and the second metal layer, the area of the overlapping region between the source electrode and the gate electrode keeps constant.

12 Claims, 7 Drawing Sheets

(51) Int. Cl.
  *H01L 29/66* (2006.01)
  *H01L 29/786* (2006.01)
  *H01L 29/423* (2006.01)
  *G02F 1/1362* (2006.01)
  *G02F 1/1368* (2006.01)
  *H01L 29/417* (2006.01)
(52) U.S. Cl.
  CPC ...... *H01L27/1259* (2013.01); *H01L 29/41733* (2013.01); *H01L 29/42384* (2013.01); *H01L 29/66742* (2013.01); *H01L 29/786* (2013.01)

(56) References Cited

FOREIGN PATENT DOCUMENTS

| | | |
|---|---|---|
| CN | 101866918 | 10/2010 |
| CN | 201845776 | 5/2011 |
| CN | 103412449 | 11/2013 |
| JP | 4368007 | 11/2009 |
| JP | 2010014828 | 1/2010 |

\* cited by examiner

US 9,219,082 B2

ARRAY SUBSTRATE AND METHOD FOR MANUFACTURING THE SAME, AND DISPLAY DEVICE

CROSS REFERENCE TO RELATED APPLICATION

This application is the U.S. national phase of PCT Application No. PCT/CN2013/089974 filed on Dec. 19, 2013, which claims priority to Chinese Patent Application No. 201310311215.0 filed on Jul. 23, 2013, the disclosures of which are incorporated in their entirety by reference herein.

FIELD OF THE INVENTION

The present invention relates to the field of display technologies, and in particular, to an array substrate and a method for manufacturing the same, and a display device.

DESCRIPTION OF THE PRIOR ART

A Thin-Film Transistor Liquid Crystal Display (TFT-LCD) includes a color film substrate, an array substrate and a liquid crystal layer located between the color film substrate and the array substrate. The array substrate includes: a transparent substrate; and a plurality of gate lines that are parallel to each other and a plurality of electrically insulating data lines that cross the gate lines vertically, which are located on the inner side of the transparent substrate, wherein said plurality of gate lines and said plurality of data lines defines a plurality of pixel units.

Each pixel unit includes a pixel electrode, a storage capacitor (Cs), a liquid crystal capacitor (Clc) and a thin film transistor (TFT) that functions as a switching equipment. The Cs and the Clc are coupled with the pixel electrode in parallel, and the pixel electrode is coupled with the TFT. As shown in FIG. 1, a TFT 10 of the pixel unit includes a source electrode 11, a gate electrode 12 and a drain electrode 13, wherein the source electrode 11 is electrically coupled with a pixel electrode 20 by a via hole 50, the gate electrode 12 is coupled with a gate line 30, the drain electrode 13 is coupled with a data line 40, the gate lines 30 and the gate electrode 12 are located on the first metal layer, and the data line 40, the drain electrode 13 and the source electrode 11 are located on the second metal layer; moreover, the source electrode 11 is overlapped with the gate electrode 12. The source electrode is overlapped with the gate electrode, thereby a parasitic capacitance (Cgs) is formed between the source electrode and the gate electrode, wherein the capacitance of the Cgs is related to the area of the overlapping region between the source electrode and the gate electrode.

For one pixel unit, when a cut-in voltage is applied on a gate line coupled with the gate electrode of the TFT of the pixel unit, the TFT will be in on state, a data voltage on the data line coupled with the drain electrode of the TFT will be applied to the pixel electrode, and the Cs and the Clc coupled in parallel to the pixel electrode will be charged. A cut-out voltage is applied to a gate line coupled with the gate electrode of the TFT, thus the TFT will be in off state, the voltage applied on the pixel electrode will jump due to the presence of the parasitic capacitance Cgs, and the amount of voltage jump on the pixel electrode is $$\Delta Vp = \frac{Cgs}{Cgs + Cs + Clc} \Delta Vg,$$

wherein $\Delta Vg$ is the difference between the cut-in voltage and the cut-out voltage applied on the gate electrode.

In practical application, because of process instability, dislocation may occur between the first metal layer and the second metal layer, so that the area of the overlapping region between the source electrode and the gate electrode of the pixel unit will be changed. If the amount of dislocation between the first metal layer and the second metal layer of adjacent pixel units is different, the variation on the area of the overlapping region between the source electrode and the gate electrode of adjacent pixel units will be different, so that the variation of the parasitic capacitance Cgs of adjacent pixel units will be different, and the parasitic capacitance Cgs of adjacent pixel units will be different after dislocation occurs between the first metal layer and the second metal layer (the parasitic capacitance Cgs of adjacent pixel units is the same as each other before dislocation occurs between the first metal layer and the second metal layer). If the amount of voltage jump on the pixel electrodes of adjacent pixel units is different when the parasitic capacitance Cgs of adjacent pixel units is different, the gray scale of the adjacent pixels will be nonuniform, so that poor picture quality will be caused, for example, Flicker (picture flicker) and Mura (nonuniform picture gray scale), etc., will occur.

In conclusion, there exists a problem of poor picture quality when the amount of dislocation between the first metal layer and the second metal layer of adjacent pixel units is different in an existing TFT-LCD.

SUMMARY OF THE INVENTION

The embodiments of the invention provides an array substrate and a method for manufacturing the same, and a display device, which solve the problem of poor picture quality in the prior art when the amount of dislocation between the first metal layer and the second metal layer of adjacent pixel units is different in a TFT-LCD.

According to the first aspect of the embodiments of the invention, there provides an array substrate comprising a thin film transistor TFT, the thin film transistor TFT comprises a source electrode, a gate electrode and a drain electrode, wherein the gate electrode is located on a first metal layer, and the source electrode and the drain electrode are located on a second metal layer, wherein:

the shapes of the source electrode and the gate electrode meet the condition that, in the case that dislocation occurs between the first metal layer and the second metal layer, the area of the overlapping region between the source electrode and the gate electrode keeps constant.

In an embodiment of the invention, in the case that dislocation occurs between the first metal layer and the second metal layer of the array substrate, the area of the overlapping region between the source electrode and the gate electrode of a pixel unit keeps constant, thus the variation on the area of the overlapping region between the source electrode and the gate electrode of each pixel unit is the same as each other (the variation is 0). Therefore it may be guaranteed that, after dislocation occurs between the first metal layer and the second metal layer, the area of the overlapping region between the source electrode and the gate electrode of adjacent pixel units still keeps the same, and the parasitic capacitance Cgs of adjacent pixel units is the same. Further, it may be guaranteed, to a certain extent, that the gray scale of adjacent pixels is uniform and the problem of poor picture quality is eliminated or alleviated.

Preferably, the source electrode comprises: an overlapping region with the gate electrode, and a first part region and a second part region located on the two sides of the gate electrode respectively in a direction parallel to the gate line;

In the case that dislocation occurs between the first metal layer and the second metal layer, an increased/decreased bottom area of the first part region equals to a decreased/increased bottom area of the second part region.

In an embodiment of the invention, by improving the structure of a source electrode in the TFT, it may be guaranteed that, in the case that dislocation occurs between the first metal layer and the second metal layer, the area of the overlapping region between the source electrode and the gate electrode keeps constant.

Preferably, a pattern consisted of the first part region, the second part region and the overlapping region with the gate electrode comprises a U-shaped pattern with an opening facing a direction parallel to the gate line and an L-shaped pattern coupled with the closed side of the U-shaped pattern and arranged laterally;

Wherein, the first part region is located at a position on one side edge of the U-shaped pattern that extends out of the gate electrode or located at a position on the two side edges of the U-shaped pattern that extend out of the gate electrode, and the second part region is located at a position on the L-shaped pattern that extends out of the gate electrode.

Preferably, a pattern consisted of the first part region, the second part region and the overlapping region with the gate electrode is an analogous ±-shaped pattern;

Wherein, the first part region is located at a position on the first side and/or the second side of the ±-shaped pattern that extends out of the gate electrode in a first direction parallel to the gate line; and the second part region is located at a position on the first side and/or the second side of the ±-shaped pattern that extends out of the gate electrode in a second direction opposite to the first direction, wherein the first side and the second side are parallel to each other.

In an embodiment of the invention, there provides a specific structure of a source electrode in the TFT, so that it will be easy for one skilled in the art to achieve the technical solution of the invention. It should be noted that, the specific structure of the source electrode in the embodiments of the invention is only used for illustrating the invention, rather than limiting the invention, and other structures that may be used for implementing the technical solutions of the invention also fall within the protection scope of the invention.

Preferably, the array substrate further comprises a data line coupled with the drain electrode, wherein the minimum distance from the first part region and the second part region to the data line is no less than a given threshold, for example, in the range of 5 μm to 10 μm.

In an embodiment of the invention, by setting a minimum distance from the first part region and the second part region to the data line no less than a given threshold, it may be avoided that short circuit occurs between the source electrode and the data line, and it may be guaranteed that the TFT has a good electrical property.

Preferably, the gate electrode comprises a first part region and a second part region that are separated from each other, and the source electrode comprises a third part region that overlaps with the first part region and a fourth part region that overlaps with the second part region;

In the case that dislocation occurs between the first metal layer and the second metal layer, an increased/decreased bottom area of the third part region equals to a decreased/increased bottom area of the fourth part region.

In an embodiment of the invention, by improving the structure of the gate electrode and the source electrode in the TFT, it may be guaranteed that, in the case that dislocation occurs between the first metal layer and the second metal layer, the area of the overlapping region between the source electrode and the gate electrode keeps constant.

Preferably, the pattern of the source electrode is an analogous inversed T-shaped pattern consisted of the third part region, the fourth part region and the region between the first part region and the second part region;

Wherein, the third part region is located at a position on the inversed T-shaped pattern that overlaps with the first part region in a first direction parallel to the gate line, and the fourth part region is located at a position on the inversed T-shaped pattern that overlaps with the second part region in a second direction opposite to the first direction.

In an embodiment of the invention, there provides a specific structure of the source electrode and the gate electrode in the TFT, so that it will be easy for one skilled in the art to achieve the technical solution of the invention. It should be noted that, the specific structures of the source electrode and the gate electrode in the embodiments of the invention are only used for illustrating the invention, rather than limiting the invention, and other structures that may be used for implementing the technical solutions of the invention also fall within the protection scope of the invention.

According to the second aspect of the embodiments of the invention, there provides a display device, which comprises the array substrate.

In an embodiment of the invention, since it can be guaranteed to a certain extent by the array substrate contained in the display device that the gray scale of adjacent pixels is uniform, the problem of poor picture quality can be eliminated or alleviated to a certain extent by the display device.

According to the third aspect of the embodiments of the invention, there provides a method for manufacturing the array substrate, comprising:

forming a gate electrode on a substrate, wherein the gate electrode is located on a first metal layer;

forming a gate electrode insulating layer, which covers the gate electrode, on the substrate; and forming an active layer, and a source electrode and a drain electrode located on the active layer in turn on the gate electrode insulating layer, wherein the source electrode and the drain electrode are located on a second metal layer;

wherein, in the case that dislocation occurs between the first metal layer and the second metal layer, the area of the overlapping region between the source electrode and the gate electrode keeps constant.

In an embodiment of the invention, in the case that dislocation occurs between the first metal layer and the second metal layer of the array substrate, the area of the overlapping region between the source electrode and the gate electrode of a pixel unit keeps constant, thus the variation on the area of the overlapping region between the source electrode and the gate electrode of each pixel unit is the same as each other (the variation is 0), so that it can be guaranteed to a certain extent that the gray scale of adjacent pixels is uniform and the problem of poor picture quality is eliminated or alleviated.

In comparison with the prior art, by employing the technical solution of the embodiments of the invention, in the case that dislocation occurs between the first metal layer and the second metal layer, the area of the overlapping region between the gate electrode and the source electrode of adjacent pixel units can also be the same even if the amount of dislocation between the first metal layer and the second metal layer of adjacent pixel units is different, so that the parasitic capacitance Cgs of adjacent pixel units is the same. Therefore, it may be guaranteed that the amount of voltage jump on the pixel electrodes of adjacent pixel units is the same and the gray scale of adjacent pixels is uniform, thereby the problem of poor picture quality, such as Flicker and Mura, etc., may be eliminated or alleviated to a certain extent.

DETAILED DESCRIPTION OF THE PREFERRED EMBODIMENTS

Figure 1:
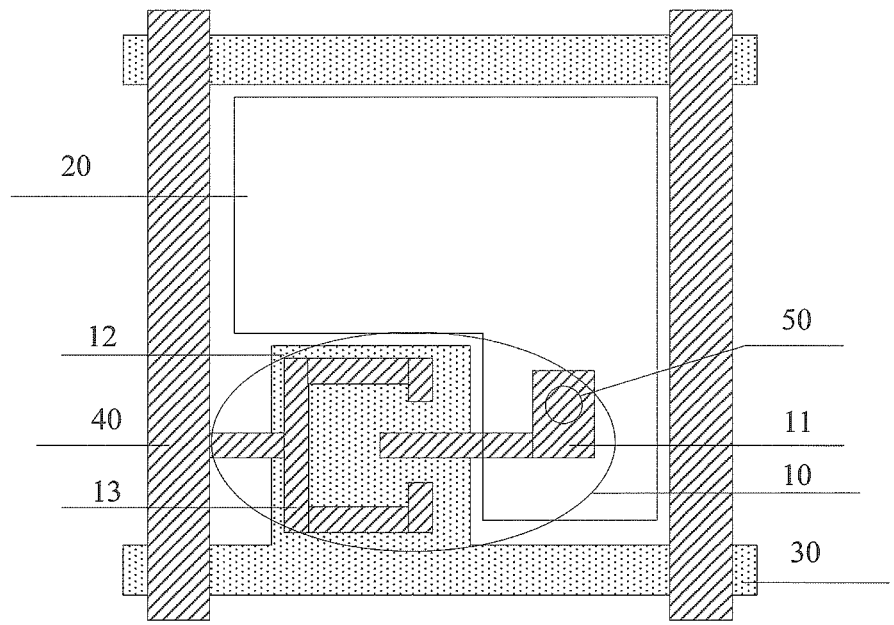
FIG. 1 is a structural representation of a pixel unit of the prior art.

An array substrate according to an embodiment of the invention comprises a TFT which comprises a source electrode, a gate electrode and a drain electrode, wherein the gate electrode is located on a first metal layer, and the source electrode and the drain electrode are located on a second metal layer, and in the case that dislocation occurs between the first metal layer and the second metal layer, the area of the overlapping region between the source electrode and the gate electrode keeps constant.

Since the area of the overlapping region between the source electrode and the gate electrode of adjacent pixel units is the same before dislocation occurs between the first metal layer and the second metal layer, the variation on the area of the overlapping region between the source electrode and the gate electrode of adjacent pixel units will be different after dislocation occurs between the first metal layer and the second metal layer, so that the area of the overlapping region between the source electrode and the gate electrode of adjacent pixel units will be different after dislocation occurs between the first metal layer and the second metal layer.

It can be guaranteed by the structure of the array substrate according to an embodiment of the invention that, in the case that dislocation occurs between the first metal layer and the second metal layer, the area of the overlapping region between the source electrode and the gate electrode keeps constant. That is, it can be guaranteed by the array substrate according to an embodiment of the invention that the variation on the area of the overlapping region between the source electrode and the gate electrode of adjacent pixel units is the same after dislocation occurs between the first metal layer and the second metal layer, so that the area of the overlapping region between the source electrode and the gate electrode of adjacent pixel units is the same after dislocation occurs between the first metal layer and the second metal layer. Therefore, it may be guaranteed to a certain extent that the gray scale of adjacent pixels is uniform and the problem of poor picture quality is eliminated or alleviated.

The embodiments of the invention will be further described in detail below in conjunction with the drawings of the specification.

An embodiment of the invention provides an array substrate comprising a TFT which includes a source electrode, a gate electrode and a drain electrode, wherein the gate electrode is located on a first metal layer, and the source electrode and the drain electrode are located on a second metal layer, wherein:

the shapes of the source electrode and the gate electrode meet the condition that, in the case that dislocation occurs between the first metal layer and the second metal layer, the area of the overlapping region between the source electrode and the gate electrode keeps constant.

It should be noted that, since in the embodiment of the invention, the array substrate includes a plurality of pixel units, each pixel unit includes a TFT, and the implementing mode of the TFT of each pixel unit contained in the array substrate according to the embodiment of the invention is similar to each other, the technical solution of the embodiment of the invention will be illustrated below by taking the implementing mode of a pixel unit contained in the array substrate according to the embodiment of the invention as an example.

Preferably, the pixel unit of the array substrate according to the embodiment of the invention includes a TFT, which includes a source electrode, a gate electrode and a drain electrode, wherein the gate electrode is located on a first metal layer, and the source electrode and the drain electrode are located on a second metal layer, wherein:

the shapes of the source electrode and the gate electrode meet the condition that, in the case that dislocation occurs between the first metal layer and the second metal layer, the area of the overlapping region between the source electrode and the gate electrode keeps constant.

It should be noted that, the embodiment of the invention is introduced by an example in which the gate electrode is a bottom gate. In specific implementation, the implementing mode of other types of gate (for example, top gate, etc.) is similar to that of the gate electrode (bottom gate) according to the embodiment of the invention, and no further description will be given here.

In specific implementation, the amount of dislocation between the first metal layer and the second metal layer caused by physical factors such as process instability is generally small, i.e., in a preset dislocation range such as in the range of ±2 µm~±5 µm. Preferably, the lower limit value of the preset dislocation range may be 0, that is, no dislocation occurs between the first metal layer and the second metal layer.

Preferably, in order to guarantee that the area of the overlapping region between the source electrode and the gate electrode keeps constant in the case that dislocation occurs between the first metal layer and the second metal layer, it needs to improve the source electrode and/or the gate electrode, which will be introduced respectively below.

1) In one embodiment of the invention, it realizes that the area of the overlapping region between the source electrode and the gate electrode keeps constant in the case that dislocation occurs between the first metal layer and the second metal layer by improving the source electrode.

Preferably, the source electrode (or, a lateral section pattern of the source electrode) includes an overlapping region with the gate electrode (or, a lateral section pattern of the gate electrode), and a first part region and a second part region located respectively on the two sides of the gate electrode (or, a lateral section pattern of the gate electrode) in a direction parallel to the gate line;

In the case that dislocation occurs between the first metal layer and the second metal layer, an increased/decreased bottom area (or, decreased/increased area) of the first part region equals to a decreased/increased bottom area (or, increased/decreased area) of the second part region.

It should be noted that the brackets in the embodiment of the invention provides a description mode on the present solution in view of the lateral section pattern of the source electrode and the gate electrode.

However, the manufacturing processes of the source electrode and the drain electrode of the thin film transistor (TFT) of the array substrate (pixel unit) according to the embodiment of the invention are the same, and the names thereof may be interchanged. The one coupled with the data line may be regarded as a drain electrode, and the one coupled with the pixel electrode may be regarded as a source electrode, and vice versa.

Figure 2:
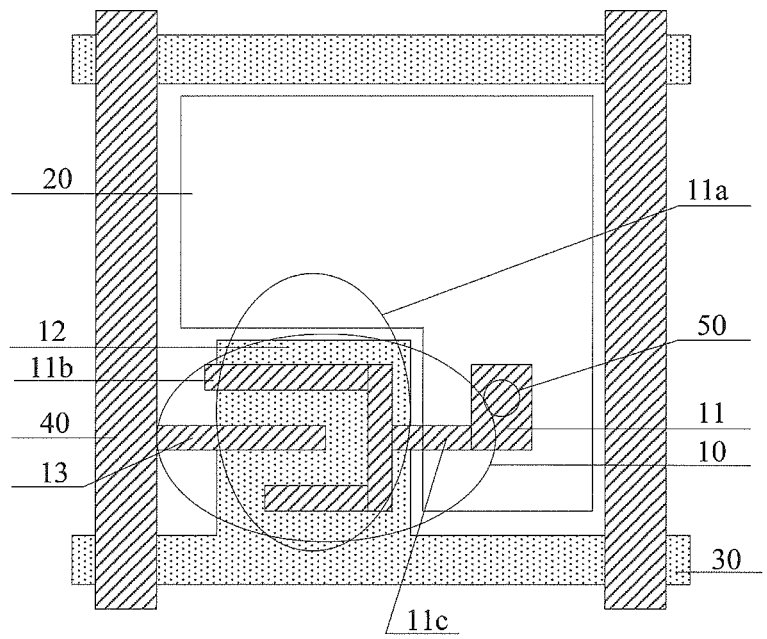
FIG. 2 is a schematic diagram showing the first structure of a pixel unit contained in the array substrate according to an embodiment of the invention.

Wherein, the array substrate (pixel unit) according to the embodiment of the invention further includes a gate line coupled vertically with the gate electrode and a data line coupled vertically with the drain electrode, wherein the direction parallel with the gate line is referred to as horizontal direction, and the direction parallel to the data line is referred to as vertical direction. For example, as shown in FIG. 2, the direction parallel to a gate line 30 is referred to as horizontal direction, and the direction parallel to a data line 40 is referred to as vertical direction. Wherein, relative to the bottom area (or, area) of the gate electrode (or, a lateral section pattern of the gate electrode), the first part region located on one side of the gate electrode (or, a lateral section pattern of the gate electrode) according to an embodiment of the invention will change after dislocation occurs between the first metal layer and the second metal layer. For example, before dislocation occurs between the first metal layer and the second metal layer, the bottom area of the first part region located on one side of the gate electrode (relative to the gate electrode) is A; after dislocation occurs between the first metal layer and the second metal layer, the bottom area of the first part region located on one side of the gate electrode (relative to the gate electrode) will be changed to B.

In specific implementation, the implementing mode of the second part region located on the other side of the gate electrode (or, a lateral section pattern of the gate electrode) according to an embodiment of the invention is similar to that of the first part region according to the embodiment of the invention, and no further description will be given here.

In specific implementation, the first part region and the second part region are regions located on the two sides of the gate electrode respectively in a direction parallel to the gate line. In the case that dislocation occurs between the first metal layer and the second metal layer, an increased/decreased bottom area of the first part region equals to a decreased/increased bottom area of the second part region, so that it may be guaranteed that the area of the overlapping region between the source electrode and the gate electrode is constant, that is, and the area of the overlapping region between the source electrode and the gate electrode keeps constant.

When left (right) dislocation (i.e., dislocation in a direction parallel to the gate line) occurs on the second metal layer relative to the first metal layer, the area of the first part region will increase (decrease), that is, the parasitic capacitance Cgs between the source electrode and the gate electrode will decrease (increase); and correspondingly, the area of the second part region will decrease (increase), that is, the parasitic capacitance Cgs between the source electrode and the gate electrode will increase (decrease). Since the increased/decreased area of the first part region may be compensated by the decreased/increased area of the second part region, it may be guaranteed that the overall parasitic capacitance Cgs between the source electrode and the gate electrode keeps constant and Flicker and Mura are avoided.

When up (down) dislocation (i.e., dislocation in the vertical direction) occurs on the second metal layer relative to the first metal layer, since the distance between the overlapping region of the source electrode (or, a lateral section pattern of the source electrode) with the gate electrode (or, a lateral section pattern of the gate electrode) and the two edges of the gate electrode (or, a lateral section pattern of the gate electrode) is large, the overlapping region between the source electrode and the gate electrode will not be influenced.

When dislocation with a certain angle occurs on the second metal layer relative to the first metal layer, the dislocation with a certain angle may be resolved into dislocation in a direction parallel to the gate line and dislocation in a direction vertical to the gate line, and the implementing modes of the dislocation in a direction parallel to the gate line and the dislocation in a direction vertical to the gate line are similar to those of the above dislocation in the direction parallel to the gate line and the above dislocation in the direction vertical to the gate line, respectively, and no further description will be given here.

Preferably, the shape of the overlapping region between the source electrode and the gate electrode (or, a lateral section pattern of the gate electrode) may be any shape that can guarantee the electrical property of the TFT.

Preferably, the shape of the overlapping region between the source electrode and the gate electrode (or, a lateral section pattern of the gate electrode) may be designed according to requirements or experiences. For example, it may be designed according to the shape of the source electrode in the TFT.

Preferably, the shapes of the first part region and the second part region may be any shapes (for example, a circle, a rectangle or an ellipse), so long as the condition that the increased/decreased area of the first part region equals to the decreased/increased area of the second part region can be met in the case that dislocation occurs between the first metal layer and the second metal layer.

Preferably, the shapes of the first part region and the second part region may be designed according to requirements or experiences.

It should be noted that, any source structure, which includes an overlapping region with the gate electrode (or, a lateral section pattern of the gate electrode) and a first part region and a second part region located respectively on the two sides of the gate electrode (or, a lateral section pattern of the gate electrode) in a direction parallel to the gate line, is applicable for the embodiment of the invention. However, the embodiments of the invention cannot exhaust all the possible source structures. The source electrode structure of the embodiments of the invention will be introduced in detail below by two preferred embodiments.

Embodiment 1

Preferably, as shown in FIG. 2, the pixel unit includes a TFT 10, a pixel electrode 20, a gate line 30 and a data line 40. The TFT 10 includes a source electrode 11, a gate electrode 12 and a drain electrode 13, wherein the source electrode 11 and the pixel electrode 20 are electrically coupled by a via hole 50, the gate electrode 12 is coupled with the gate line 30, and the drain electrode 13 is coupled with the data line 40. Wherein, the gate electrode 12 and the gate line 30 are located on the first metal layer, and the source electrode 11, the drain electrode 13 and the data line 40 are located on second metal layer.

The source electrode 11 (or, a lateral section pattern of the source electrode 11) includes an overlapping region 11a with the gate electrode 12 (or, a lateral section pattern of the gate electrode 12, and a first part region 11b and a second part region 11c located respectively on the two sides of the gate electrode 12 (or, a lateral section pattern of the gate electrode 12) in a direction parallel to the gate line. The pattern consisted of the first part region 11b, the second part region 11c and the overlapping region 11a with the gate electrode 12 (or, a lateral section pattern of the gate electrode 12) includes a U-shaped pattern with an opening facing a direction parallel to the gate line and an L-shaped pattern coupled with the closed side of the U-shaped pattern and arranged laterally, wherein the first part region 11b is located at a position on one side edge of the U-shaped pattern that extends out of the gate electrode 12 (or, a lateral section pattern of the gate electrode 12), or located at a position on the two side edges of the U-shaped pattern that extend out of the gate electrode 12 (or, a lateral section pattern of the gate electrode 12); and the second part region 11c is located at a position on the L-shaped pattern that extends out of the gate electrode 12 (or, a lateral section pattern of the gate electrode 12).

Figure 4:
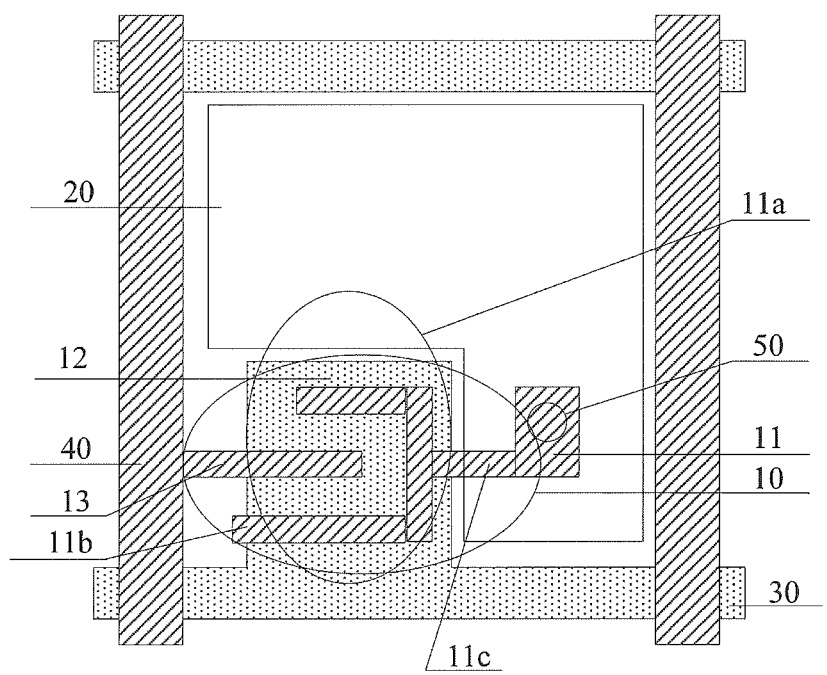
FIG. 4 is a schematic diagram showing the third structure of the pixel unit contained in the array substrate according to an embodiment of the invention.
Figure 5:
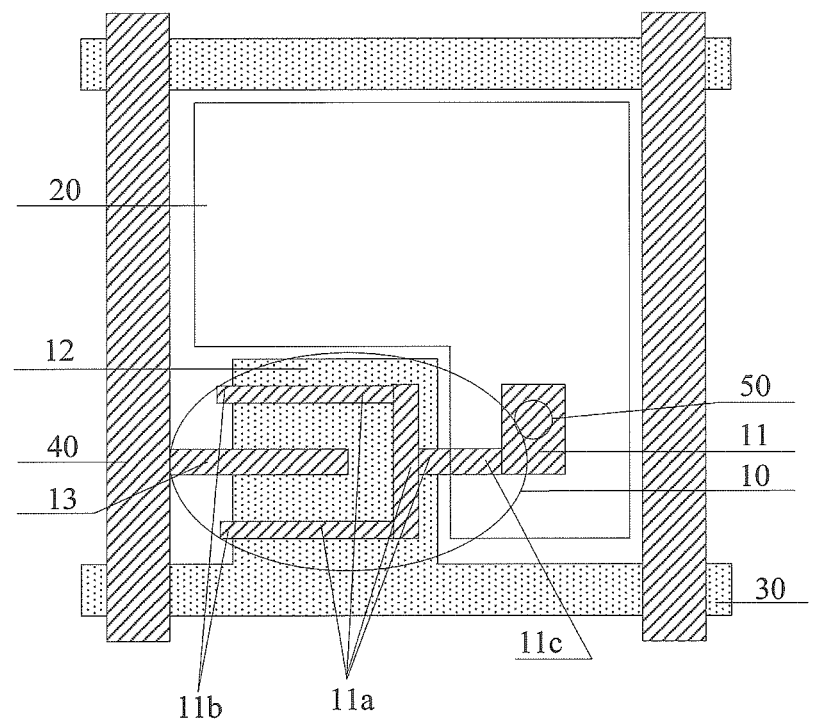
FIG. 5 is a schematic diagram showing the fourth structure of the pixel unit contained in the array substrate according to an embodiment of the invention.

In specific implementation, the opening of the U-shaped pattern may face the drain electrode or be opposed to the drain electrode. Preferably, the opening of the U-shaped pattern faces the drain electrode. When the opening of the U-shaped pattern faces the drain electrode, as shown in FIG. 2 and FIG. 4, the first part region 11b is located on one side edge of the U-shaped pattern that extends in the direction departing from the via hole 50; or as shown in FIG. 5, located on the two side edges of the U-shaped pattern that extend in the direction departing from the via hole 50; the drain electrode 13 (or, a lateral section pattern of the drain electrode 13) is located between the two side edges of the U-shaped pattern, the L-shaped pattern arranged laterally is a an L-shaped pattern that rotates 45 degrees to the left, and the second part region 11c is electrically coupled with the pixel electrode 20 by the via hole 50.

In specific implementation, the implementing mode of the source electrode when the opening of the U-shaped pattern is opposed to the drain electrode is similar to that of the source electrode when the opening of the U-shaped pattern faces the drain electrode, except that when the opening of the U-shaped pattern is opposed to the drain electrode, the L-shaped pattern arranged laterally is an L-shaped pattern that rotates 45 degrees to the left and is turned over vertically, and the drain electrode (or, a lateral section pattern of the drain electrode) is parallel to the L-shaped pattern arranged laterally.

Figure 3:
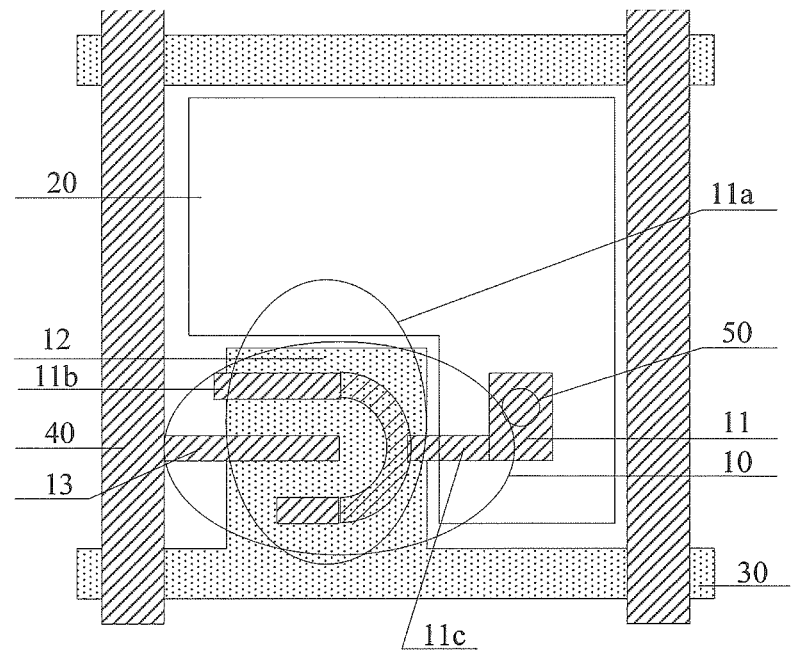
FIG. 3 is a schematic diagram showing the second structure of the pixel unit contained in the array substrate according to an embodiment of the invention.

Preferably, the shapes of the side edge and the closed side of the U-shaped pattern that overlap with the gate electrode (or, a lateral section pattern of the gate electrode), i.e., the shapes of the side edge and the closed side located in the overlapping region with the gate electrode (or, a lateral section pattern of the gate electrode), may be designed according to requirements or experiences. For example, as shown in FIG. 2, the shape of the closed side of the U-shaped pattern is a rectangle, and as shown in FIG. 3, the shape of the closed side of the U-shaped pattern is an arc.

Preferably, the shapes of the first part region and the second part region may be regular shapes, or may be irregular shapes. For example, as shown in FIG. 2, the shape of the first part region 11b is a rectangle, and the shape of the second part region 11c is an L-shaped pattern arranged laterally.

In specific implementation, as required, the shape of the second part region may also be changed from the L-shaped pattern to other shapes. For example, it may be changed to a rectangle that is vertical to the closed side of the U-shaped pattern, i.e., the shape of the second part region is a --shaped pattern. Preferably, when the position of the first part region is different, it requires that the size of the first part region should be the same or different, so as to achieve that the increased/decreased area of the first part region equals to the decreased/increased area of the second part region in the case that dislocation occurs between the first metal layer and the second metal layer.

For example, as shown in FIG. 2, the first part region 11b is located at a position on one side edge of the U-shaped pattern (the upper edge of the upper and lower edges adjacent to the gate electrode 12, wherein the lower edge of the gate electrode 12 contacts the gate line 30, the upper edge of the gate electrode 12 is away from the gate line 30, and the upper edge of the gate electrode 12 and the lower edge of the gate electrode 12 are parallel with each other) that extends out of the sectional pattern of the gate electrode 12, and the shape of the first part region 11b is a rectangle; the second part region 11c is located at a position on the L-shaped pattern that extends out of the sectional pattern of the gate electrode 12, and the shape of the second part region 11c is an L-shaped pattern arranged laterally.

Since in the case that dislocation occurs between the first metal layer and the second metal layer, the length variation of the first part region 11b equals to that of the second part region 11c, in order to realize that an increased/decreased area of the first part region 11b equals to a decreased/increased area of the second part region 11c in the case that dislocation occurs between the first metal layer and the second metal layer, it requires that the width of the first part region 11b equals to the width of the rectangle in the horizontal region of the second part region 11c. Preferably, the range of the width of the first part region 11b is in the range of 5 μm to 10 μm.

For example, as shown in FIG. 4, the first part region 11b is located at a position on one side edge of the U-shaped pattern (the lower edge of the upper and lower edges adjacent to the gate electrode 12) that extends out of the sectional pattern of the gate electrode 12, and the shape of the first part region 11b is a rectangle; the second part region 11c is located at a position on the L-shaped pattern that extends out of the sectional pattern of the gate electrode 12, and the shape of the second part region 11c is an L-shaped pattern arranged laterally.

Since in the case that dislocation occurs between the first metal layer and the second metal layer, the length variation of the first part region 11b equals to that of the second part region 11c, in order to achieve that an increased/decreased area of the first part region 11b equals to a decreased/increased area of the second part region 11c in the case that dislocation occurs between the first metal layer and the second metal layer, it requires that the width of the first part region 11b equals to the width of the rectangle in the horizontal region of the second part region 11c (the implementing mode of the width of the first part region 11b and the second part region 11c in FIG. 2 and FIG. 4 is similar to each other).

For example, as shown in FIG. 5, the first part region 11b is located at a position on the two side edges of the U-shaped pattern that extend out of the sectional pattern of the gate electrode 12, and the shape of the first part region 11b is a rectangle; the second part region 11c is located at a position on the L-shaped pattern that extends out of the sectional pattern of the gate electrode 12, and the shape of the second part region 11c is an L-shaped pattern arranged laterally.

Since in the case that dislocation occurs between the first metal layer and the second metal layer, the length variation of the first part region 11b equals to that of the second part region 11c, in order to achieve that an increased/decreased area of the first part region 11b equals to a decreased/increased area of the second part region 11c in the case that dislocation occurs between the first metal layer and the second metal layer, it requires that the sum of the widths of the first part regions 11b located respectively at a position on the two side edges of the U-shaped pattern that extend out of the sectional pattern of the gate electrode 12 equals to the width of the rectangle in the horizontal region of the second part region 11c. Preferably, the range of the width of the rectangle in the horizontal region of the second part region 11c is in the range of 5 μm to 10 μm.

Preferably, the width of the first part region may also be set according to requirements or experiences. For example, it may be determined according to the experiences of pixel unit design.

Preferably, the amount of dislocation between the first metal layer and the second metal layer caused by physical factors such as process instability is in a preset dislocation range, in order to achieve that in the case that dislocation occurs between the first metal layer and the second metal layer, the increased/decreased area of the first part region equals to the decreased/increased area of the second part region, the minimum distance between the two edges of the source electrode and the gate electrode (the left edge and the right edge) should be no less than the upper limit value of the preset dislocation range. An introduction will be given below by taking FIG. 2 as an example.

For example, as shown in FIG. 2, the shape of the first part region 11b is a rectangle, and the shape of the second part region 11c is an L-shaped pattern arranged laterally. The length of the first part region 11b (i.e., the distance from the first part region 11b to the left edge of the gate electrode 12) is the first distance, the length of the rectangle in the horizontal region of the second part region 11c is the second distance, the distance from one side edge of the U-shaped pattern that is parallel to the first part region 11b to the left edge of the gate electrode 12 is the third distance, and the distance from the closed side of the U-shaped pattern to the right edge of the gate electrode 12 is the fourth distance. Wherein, the minimum value of the first distance, the second distance, the third distance and the fourth distance is no less than the upper limit value of the preset dislocation range.

In specific implementation, the first distance may be set according to requirements or experiences. Preferably, the range of the first distance is in the range of 1 μm to 5 μm.

In specific implementation, the larger the first distance, the second distance, the third distance and the fourth distance are, the larger the upper limit value of the preset dislocation range will be, the larger the preset dislocation range will be, and the smaller the probability of Flicker and Mura will be.

Preferably, the first distance, the second distance, the third distance and the fourth distance equal to each other. In specific implementation, when the first distance, the second distance, the third distance and the fourth distance equal to each other, it may not only be guaranteed that the upper limit value of the preset dislocation range is larger, but also be guaranteed that the TFT has a good electrical property.

Preferably, the minimum distance from the first part region and the second part region to the data line (or, a lateral section pattern of the data line) is no less than a preset distance threshold. In specific implementation, the distance threshold may be set according to requirements or experiences. For example, it may be determined according to the experiences of pixel unit design. Preferably, the range of the distance threshold is in the range of 5 μm to 10 μm.

In specific implementation, the minimum distance from the first part region and the second part region to the data line (or, a lateral section pattern of the data line) is no less than a distance threshold, thus the short circuit between the source electrode and the data line may be prevented.

Preferably, the minimum distance between the upper edge of the gate electrode and the source electrode is no less than a pitch threshold. In specific implementation, the pitch threshold may be set according to requirements or experiences. Preferably, the range of the pitch threshold is in the range of 3 μm to 5 μm.

Embodiment 2

Figure 6:
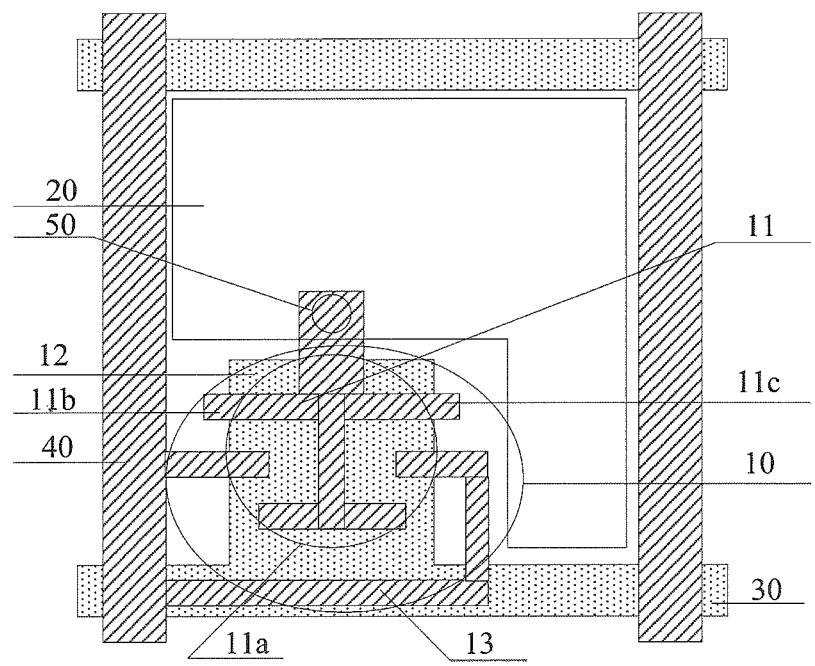
FIG. 6 is a schematic diagram showing the fifth structure of the pixel unit contained in the array substrate according to an embodiment of the invention.

Preferably, as shown in FIG. 6, the pattern consisted of the first part region 11b, the second part region 11c and the overlapping region 11a with the gate electrode 12 (or, a lateral section pattern of the gate electrode 12) is an analogous ±-shaped pattern. In order to achieve that in the case that dislocation occurs between the first metal layer and the second metal layer, the area of the overlapping region between the source electrode and the gate electrode keeps constant, there exist a plurality of implementing modes for the first part region and the second part region.

Preferably, the first part region is located at a position on the first side and/or the second side of the ±-shaped pattern that extends out of the gate electrode (or, a lateral section pattern of the gate electrode) in a first direction parallel to the gate line; and the second part region is located at a position on the first side and/or the second side of the ±-shaped pattern that extends out of the gate electrode (or, a lateral section pattern of the gate electrode) in a second direction opposite to the first direction, wherein the first side and the second side are parallel with each other.

A plurality of implementing modes for the first part region and the second part region will be respectively introduced below.

Implementing Mode 1: as shown in FIG. 6, the first part region 11b is located at a position on the first side of the ±-shaped pattern that extends out of the gate electrode 12 (or, a lateral section pattern of the gate electrode 12) in a first direction parallel to the gate line, and the second part region 11c is located at a position on the first side of the ±-shaped pattern that extends out of the gate electrode 12 (or, a lateral section pattern of the gate electrode 12) in a second direction opposite to the first direction.

Preferably, the width of the first part region 11b equals to the width of the second part region 11c.

In specific implementation, the implementing mode of the width of the first part region 11b and the second part region 11c is similar to that of the width of the first part region 11b in FIG. 2, and no further description will be given here.

Preferably, the minimum distance between the two edges (the left edge and the right edge) of the source electrode 11 and the gate electrode 12 is no less than the upper limit value of the preset dislocation range.

For example, as shown in FIG. 6, the shape of the first part region 11b is a rectangle, and the shape of the second part region 11c is a rectangle.

The length of the first part region 11b and the second part region 11c (i.e., the distance from the first part region 11b to the left edge of the gate electrode 12, and the distance from the second part region 11c to the right edge of the gate electrode 12) is the first distance, and the distance from the side of the ±-shaped pattern that completely overlaps with the sectional pattern of the gate electrode 12 to the left edge of the gate electrode 12 is the second distance, wherein, the minimum value of the first distance and the second distance is no less than the upper limit value of the preset dislocation range.

In specific implementation, the implementing mode of the first distance and the second distance is similar to that of the first distance and the second distance in Embodiment 1, and no further description will be given here.

Implementing Mode 2: the first part region is located at a position on the second side of the ±-shaped pattern that extends out of the gate electrode (or, a lateral section pattern of the gate electrode) in a first direction parallel to the gate line, and the second part region is located at a position on the second side of the ±-shaped pattern that extends out of the gate electrode (or, a lateral section pattern of the gate electrode) in a second direction opposite to the first direction.

Implementing Mode 3: the first part region is located at a position on the first side of the ±-shaped pattern that extends out of the gate electrode (or, a lateral section pattern of the gate electrode) in a first direction parallel to the gate line, and the second part region is located at a position on the second side of the ±-shaped pattern that extends out of the gate electrode (or, a lateral section pattern of the gate electrode) in a second direction opposite to the first direction.

Implementing Mode 4: the first part region is located at a position on the second side of the ±-shaped pattern that extends out of the gate electrode (or, a lateral section pattern of the gate electrode) in a first direction parallel to the gate line, and the second part region is located at a position on the first side of the ±-shaped pattern that extends out of the gate electrode (or, a lateral section pattern of the gate electrode) in a second direction opposite to the first direction.

In specific implementation, Implementing Mode 2-Implementing Mode 4 are similar to Implementing Mode 1, and no further description will be given here.

Implementing Mode 5: the first part region is located at a position on the first side and the second side of the ±-shaped pattern that extend out of the gate electrode (or, a lateral section pattern of the gate electrode) in a first direction parallel to the gate line, and the second part region is located at a position on the first side or the second side of the ±-shaped pattern that extends out of the gate electrode (or, a lateral section pattern of the gate electrode) in a second direction opposite to the first direction.

Preferably, the sum of the widths of the first part region equals to the width of the second part region.

In specific implementation, the implementing mode of the width of the first part region and the second part region is similar to that of the width of the first part region 11b and the second part region 11c in FIG. 5, and no further description will be given here.

Preferably, the minimum distance between the two edges of the source electrode and the gate electrode (the left edge and the right edge) should be no less than the upper limit value of the preset dislocation range. Specifically, reference may be made to the implementation of Implementing Mode 1 of the embodiment of the invention.

Implementing Mode 6: the first part region is located at a position on the first side or the second side of the ±-shaped pattern that extends out of the gate electrode (or, a lateral section pattern of the gate electrode) in a first direction parallel to the gate line, and the second part region is located at a position on the first side and the second side of the ±-shaped pattern that extend out of the gate electrode (or, a lateral section pattern of the gate electrode) in a second direction opposite to the first direction.

Preferably, the sum of the widths of the second part region equals to the width of the first part region.

In specific implementation, the implementing mode of the width of the first part region and the second part region is similar to that of the width of the first part region 11b and the second part region 11c in FIG. 5, and no further description will be given here.

Preferably, the minimum distance between the two edges of the source electrode and the gate electrode (the left edge and the right edge) is no less than the upper limit value of the preset dislocation range. Specifically, reference may be made to the implementation of Implementing Mode 1 of the embodiment of the invention.

Implementing Mode 7: the first part region is located at a position on the first side and the second side of the ±-shaped pattern that extend out of the gate electrode (or, a lateral section pattern of the gate electrode) in a first direction, and the second part region is located at a position on the first side and the second side of the ±-shaped pattern that extend out of the gate electrode (or, a lateral section pattern of the gate electrode) in a second direction opposite to the first direction.

Preferably, the sum of the widths of the second part region equals to the sum of the widths of the first part region.

In specific implementation, the implementing mode of the width of the first part region and the second part region is similar to that of the width of the first part region 11b in FIG. 5, and no further description will be given here.

Preferably, the shape of the first part region and the second part region is a rectangle, and the length of the first part region and the second part region is the first distance, thus the upper limit value of the preset dislocation range is the first distance.

Preferably, the minimum distance from the first part region and the second part region to the data line (or, a lateral section pattern of the data line) is no less than a distance threshold. In specific implementation, the distance threshold may be set according to requirements or experiences. For example, it may be determined according to the experiences of pixel unit design. Preferably, the range of the distance threshold is in the range of 5 μm to 10 μm.

In specific implementation, the minimum distance from the first part region and the second part region to the data line (or, a lateral section pattern of the data line) is no less than a distance threshold, thus the short circuit between the source electrode and the data line may be prevented.

Preferably, the minimum distance between the upper edge of the gate electrode and the source electrode is no less than a pitch threshold. In specific implementation, the pitch threshold may be set according to requirements or experiences. Preferably, the range of the pitch threshold is in the range of 3 μm to 5 μm.

It should be noted that, the above two embodiments are only two referred implementing modes for the source that are obtained by improving the embodiment of the invention, and a source electrode structure obtained by simply changing the source electrode structure in the embodiment of the invention can meet the requirement that the area of the overlapping region between the source electrode and the gate electrode keeps constant in the case that dislocation occurs between the first metal layer and the second metal layer; other source structures, which can meet the requirement that the area of the overlapping region between the source electrode and the gate electrode keeps constant in the case that dislocation occurs between the first metal layer and the second metal layer, all fall within the protection scope of the embodiments of the invention.

2) In one embodiment of the invention, by improving the gate electrode, it achieves that the area of the overlapping region between the source electrode and the gate electrode keeps constant in the case that dislocation occurs between the first metal layer and the second metal layer.

Preferably, the gate electrode (or, a lateral section pattern of the gate electrode) includes a first part region and a second part region. In the case that dislocation occurs between the first metal layer and the second metal layer, a decrease/increase area of the overlapping region between the source electrode (or, a lateral section pattern of the source electrode) and the first part region equals to an increase/decrease area of the overlapping region between the source electrode (or, a lateral section pattern of the source electrode) and the second part region.

It should be noted that, any technical solution, which achieves that the area of the overlapping region between the source electrode and the gate electrode keeps constant in the case that dislocation occurs between the first metal layer and the second metal layer by improving the gate electrode structure, is applicable for the embodiment of the invention.

In specific implementation, the increased (or decreased) area of the overlapping region between the source electrode (or, a lateral section pattern of the source electrode) and the first part region may be compensated by the decreased (or increased) area of the overlapping region between the source electrode (or, a lateral section pattern of the source electrode) and the second part region, so that it may be guaranteed that the overall parasitic capacitance Cgs between the source electrode and the gate electrode keeps constant and Flicker and Mura are avoided.

In one embodiment of the invention, by improving the source electrode and the gate electrode, it achieves that the area of the overlapping region between the source electrode and the gate electrode keeps constant in the case that dislocation occurs between the first metal layer and the second metal layer.

Preferably, the gate electrode (or, a lateral section pattern of the gate electrode) includes a first part region and a second part region that are separated from each other; the source electrode (or, a lateral section pattern of the source electrode) includes a third part region overlapping with the first part region, and a fourth part region overlapping with the second part region;

In the case that dislocation occurs between the first metal layer and the second metal layer, an increased/decreased bottom area (or, area) of the third part region equals to a decreased/increased bottom area (or, area) of the fourth part region.

It should be noted that, any technical solution, which achieves by improving the source electrode and the gate electrode that an increased/decreased bottom area (or, area) of the third part region equals to a decreased/increased bottom area (or, area) of the fourth part region in the case that dislocation occurs between the first metal layer and the second metal layer so as to guarantee that the area of the overlapping region between the source electrode and the gate electrode keeps constant, is applicable for the embodiment of the invention In specific implementation, an increased/decreased bottom area (or, area) of the third part region may be compensated by a decreased/increased bottom area (or, area) of the fourth part region, so that it may be guaranteed that the overall parasitic capacitance Cgs between the source electrode and the gate electrode keeps constant and Flicker and Mura are avoided.

A technical solution for achieving that the area of the overlapping region between the source electrode and the gate electrode keeps constant by improving the source electrode and the gate electrode will be introduced below by a specific embodiment.

Figure 7:
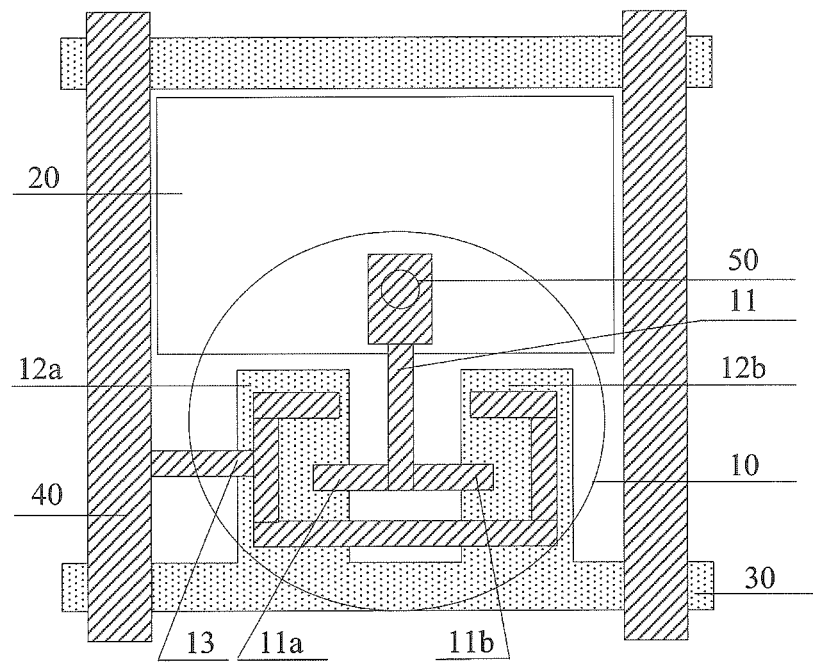
FIG. 7 is a schematic diagram showing the sixth structure of the pixel unit contained in the array substrate according to an embodiment of the invention.

Preferably, as shown in FIG. 7, the gate electrode 12 (or, a lateral section pattern of the gate electrode 12) includes a first part region 12a and a second part region 12b that are separated from each other; the source electrode 11 (or, a lateral section pattern of the source electrode 11) includes a third part region 11a overlapping with the first part region 12a and a fourth part region 11b overlapping with the second part region 12b. The source electrode 11 (or, a lateral section pattern of the source electrode) is an analogous inversed T-shaped pattern consisted of the third part region 11a, the fourth part region 11b and a region 11c located between the first part region 12a and the second part region 12b. Wherein the third part region 11a is located at a position on the inversed T-shaped pattern that overlaps with the first part region 12a in a first direction parallel to the gate line, and the fourth part region 11b is located at a position on the inversed T-shaped pattern that overlaps with the second part region 12b in a second direction opposite to the first direction.

In specific implementation, the shape of the third part region 11a and the fourth part region 11b may be designed according to requirements or experiences. Preferably, as shown in FIG. 7, the shape of the third part region 11a and the fourth part region 11b is a rectangle.

Preferably, the width of the third part region 11a equals to that of the fourth part region 11b.

Preferably, when the length of the third part region 11a equals to that of the fourth part region 11b, the upper limit value of the preset dislocation range will be the length of the third part region 11a.

In specific implementation, the larger the length of the third part region 11a is, the greater the upper limit value of the preset dislocation range will be, the larger the preset dislocation range will be, and the smaller the probability of Flicker and Mura will be.

A display device according to an embodiment of the invention includes the array substrate as described above. The display device may be any product or component with a display function, for example, liquid crystal panel, electronic paper, OLED panel, mobile phone, tablet computer, TV set, display, notebook computer, digital photo frame and navigator, etc.

Figure 8:
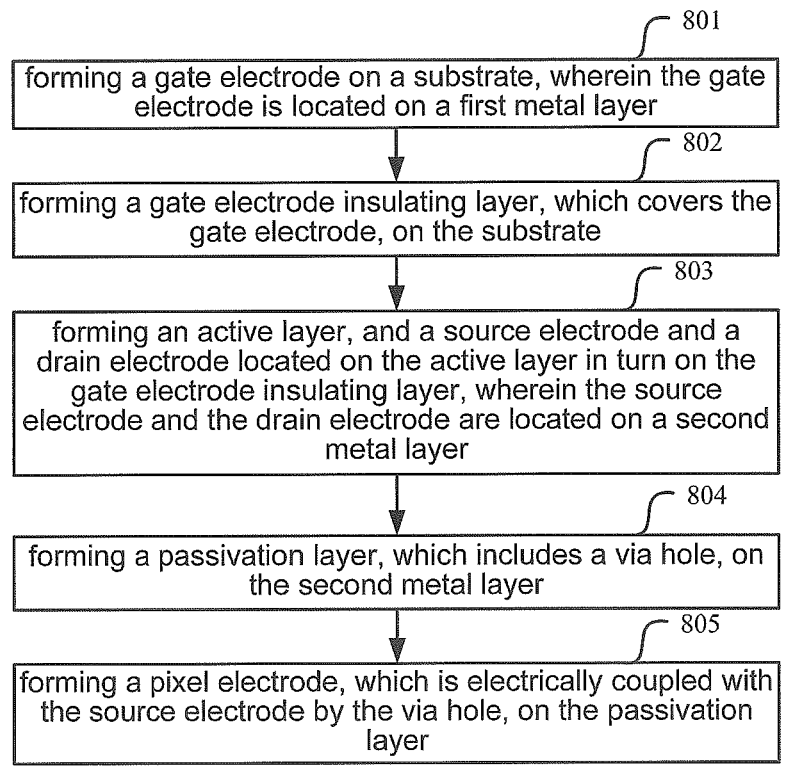
FIG. 8 is a schematic flow chart of a method for manufacturing an array substrate according to an embodiment of the invention.

According to a preferred embodiment of the invention, as shown in FIG. 8, there provides a method for manufacturing an array substrate, which includes:

Step 801: forming a gate electrode on a substrate, wherein the gate electrode is located on a first metal layer;

Step 802: forming a gate electrode insulating layer, which covers the gate electrode, on the substrate;

Step 803: forming an active layer, and a source electrode and a drain electrode located on the active layer in turn on the gate electrode insulating layer, wherein the source electrode and the drain electrode are located on a second metal layer;

wherein in the case that dislocation occurs between the first metal layer and the second metal layer, the area of the overlapping region between the source electrode and the gate electrode keeps constant.

Preferably, Step 801 of forming a gate electrode on a substrate includes:

depositing a gate electrode metal layer on the substrate by sputtering or heat evaporation; and etching the gate electrode metal layer to form a gate electrode.

In specific implementation, the implementing mode of the substrate is similar to that of a substrate in the prior art. Preferably, the substrate is a glass substrate, a quartz substrate or a flexible substrate.

In specific implementation, the implementing mode of the gate electrode metal layer is similar to that of a gate electrode metal layer in the prior art. Preferably, the gate electrode metal layer is at least a layer of thin film consisted of a metal of Cr, Ti, Ta, Mo, Al and Cu, or an alloy thereof. Preferably, the thickness range of the gate electrode metal layer is in the range of 500 Å to 4000 Å.

Preferably, when etching a gate electrode metal layer, gates with different shapes may be etched by employing mask plates with different patterns. For example, the gate electrode may be formed by a photoetching process, which includes: coating a photoresist, exposing by a mask plate, developing, etching and peeling off the photoresist.

Figure 9A:
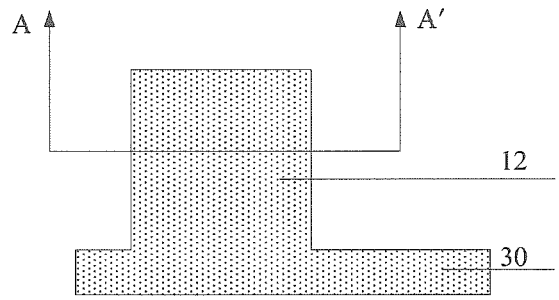
FIG. 9A-FIG. 9H are structural representations of the pixel unit contained in the array substrate during the manufacturing process of an array substrate according to an embodiment of the invention.
Figure 9B:
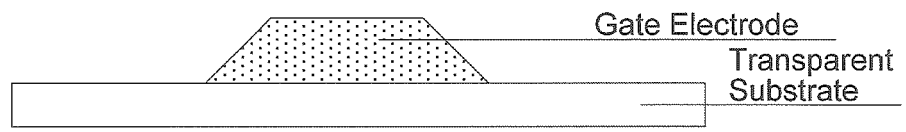

Preferably, when forming a gate electrode, the gate electrode metal layer may be etched as required, and a gate line may be formed simultaneously. For example, for the forming of the gate electrode and the gate line in FIG. 2, FIG. 9A shows a plane view of the gate electrode and the gate line formed on the substrate, and FIG. 9B shows a sectional view taken along the direction A-A' in FIG. 9A.

Preferably, Step 802 of forming a gate electrode insulating layer, which covers the gate electrode, on the substrate includes: forming a gate electrode insulating layer, which covers the gate electrode, on the substrate by plasma enhanced chemical vapor deposition (PECVD).

In specific implementation, when a gate line is formed on the substrate, the gate electrode insulating layer covers the gate electrode and the gate line at the same time. Preferably, the reacting gas for forming the gate electrode insulating layer may be a gas mixture of $SiH_4$, $NH_3$ and $N_2$, and the material of the gate electrode insulating layer includes one of an oxide, a nitride and an oxygen-nitrogen compound. Preferably, the thickness range of the gate electrode insulating layer is in the range of 1000 Å to 4000 Å.

Preferably, Step 803 of forming an active layer, and a source electrode and a drain electrode located on the active layer in turn on the gate electrode insulating layer includes: depositing an active layer on the gate electrode insulating layer by PECVD, and depositing a source-drain electrode metal layer on the active layer by sputtering or heat evaporation; and etching the active layer and the source-drain metal layer to form an active layer, and a source electrode and a drain electrode located on the active layer.

In specific implementation, the implementing mode of the active layer is similar to that of an active layer in the prior art. Preferably, the thickness range of the active layer is in the range of 1000 Å to 4000 Å. Preferably, the active layer includes a semiconductor layer and a doped semiconductor layer (i.e., an ohmic contact layer), wherein the thickness range of the semiconductor layer is in the range of 1000 Å to 3000 Å, and the thickness range of the doped semiconductor layer is in the range of 300 Å to 600 Å. Preferably, the reacting gas for forming the active layer includes a gas mixture of $SiH_4$ and $H_2$ and a gas mixture of $SiH_2Cl_2$ and $H_2$.

In specific implementation, the implementing mode of the source-drain metal layer is similar to that of a source-drain electrode metal layer in the prior art. Preferably, the thickness range of the source electrode-drain metal layer is in the range of 500 Å to 2500 Å. Preferably, the material of the source-drain metal layer is one of the metals of Cr, W, Ti, Ta, Mo, Al and Cu, or an alloy thereof.

In specific implementation, the corresponding active layer region between the source electrode and the drain electrode is a region corresponding to the TFT channel pattern; and during the etching process, the doped semiconductor layer in the region corresponding to the TFT channel pattern are completely etched.

Preferably, during the etching of the source-drain metal layer, sources and drains with different shapes are etched by employing mask plates with different patterns.

Figure 9C:
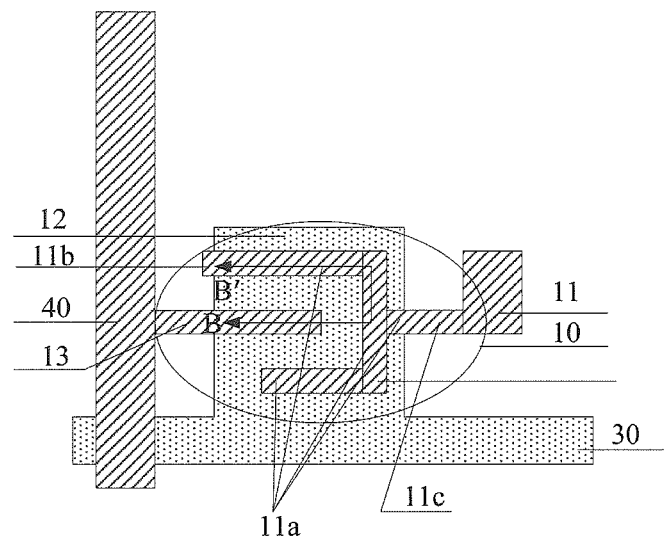
Figure 9D:
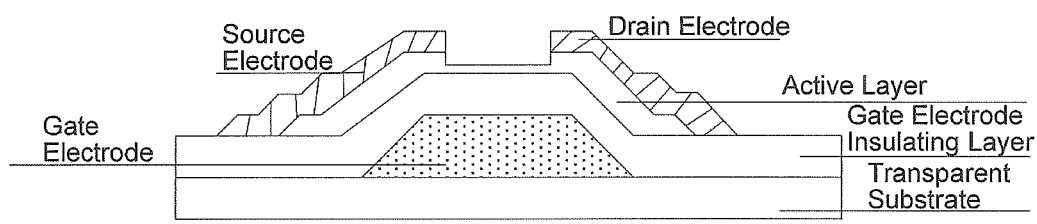

Preferably, during forming of the source electrode and the drain electrode, the source-drain metal layer may be etched as required to form a data line simultaneously. For example, for the forming of the source electrode, the drain electrode and the data line in FIG. 2, FIG. 9C shows a plane view of the source electrode, the drain electrode and the data line formed on the active layer, wherein the drain electrode is a linear electrode, the source electrode includes a U-shaped electrode and a linear electrode, and a branch piece of the linear electrode and the U-shaped electrode exceeds the edge of the gate electrode, and FIG. 9D shows a sectional view taken along the direction B-B' in FIG. 9C.

Preferably, after Step 803, the method further includes:

Step 804: forming a passivation layer, which includes a via hole, on the second metal layer;

Step 805: forming a pixel electrode, which is electrically coupled with the source electrode by the via hole, on the passivation layer.

Preferably, in Step 804, forming a passivation layer, which includes a via hole, on the second metal layer includes:

depositing a passivation layer on the second metal layer by PECVD process; and etching the passivation layer at the position corresponding to the source electrode to form the via hole that exposes the source electrode.

In specific implementation, the implementing mode of the passivation layer is similar to that of a passivation layer in the prior art.

Preferably, the thickness range of the passivation layer is in the range of 700 Å to 2000 Å. Preferably, the reacting gas for forming the passivation layer may be a gas mixture of $SiH_4$, $NH_3$ and $N_2$ or a gas mixture of $SiH_2Cl_2$, $NH_3$ and $N_2$, and the material of the passivation layer includes one of an oxide, a nitride or an oxygen-nitrogen compound.

Figure 9E:
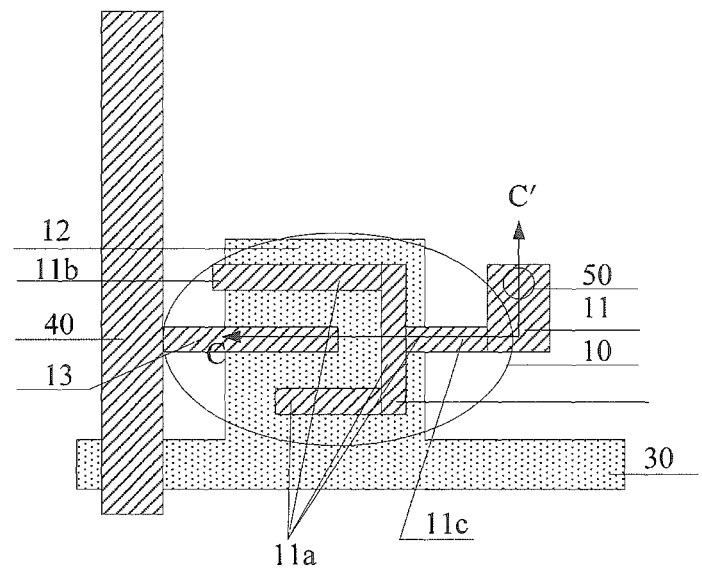
Figure 9F:
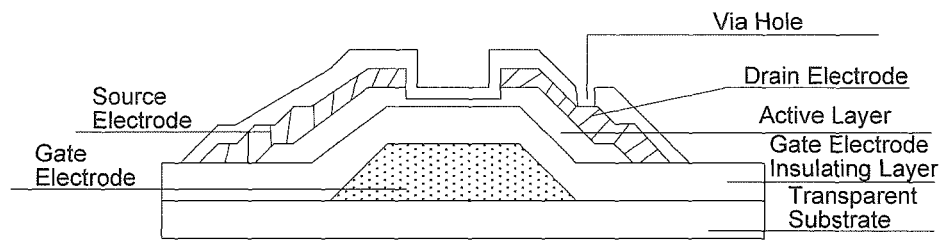

For example, for the forming of the via hole in FIG. 2, FIG. 9E shows a plane view of the passivation layer, which includes a via hole, formed on the second metal layer, wherein the source electrode is electrically coupled with the pixel electrode by the via hole, and FIG. 9F shows a sectional view taken along the direction C-C' in FIG. 9E.

Preferably, Step 805 of forming a pixel electrode, which is electrically coupled with the source electrode by the via hole, on the passivation layer includes: depositing a transparent conductive layer on the passivation layer via sputtering or heat evaporation; and etching the transparent conductive layer to form a pixel electrode, which is electrically coupled with the source electrode by the via hole, in the pixel region.

In specific implementation, the implementing mode of the transparent conductive layer is similar to that of a transparent conductive layer in the prior art.

Preferably, the thickness range of the transparent conductive layer is in the range of 300 Å to 600 Å. Preferably, the material of the transparent conductive layer includes one or more of tin indium oxide, zinc indium oxide and zinc aluminium oxide.

Figure 9G:
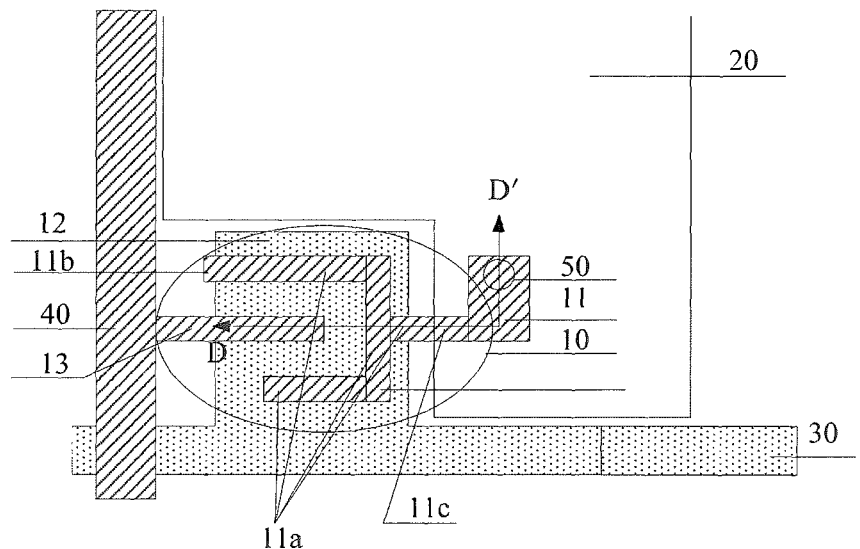
Figure 9H:
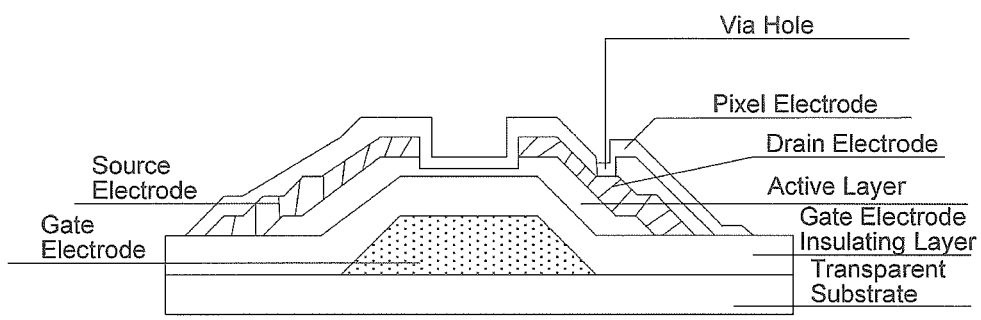

For example, for the forming of the pixel electrode in FIG. 2, FIG. 9G shows a plane view of the pixel electrode, which is electrically coupled with the source electrode by the via hole, formed on the passivation layer, and FIG. 9H shows a sectional view taking along the direction D-D' in FIG. 9G.

Although some preferred embodiments of the invention have been described, additional variations and modifications can be made on these embodiments by one skilled in the art on the basis of the creative concepts of the invention. Therefore, the appended claims of the invention should be construed as covering the preferred embodiments and all the variations and modifications falling within the scope of the invention.

Apparently, various modifications and variations may be made by one skilled in the art without departing from the spirit and scope of the invention. Thus, if such modifications and variations of the invention pertain to the scope of the appended claims and their equivalents, the invention also intends to encompass these modifications and variations.

What is claimed is:

1. An array substrate comprising a thin film transistor, the thin film transistor comprises a source electrode, a gate electrode and a drain electrode, wherein the gate electrode is located on a first metal layer, and the source electrode and the drain electrode are located on a second metal layer, wherein:
   the shapes of the source electrode and the gate electrode are configured so that when dislocation occurs between the first metal layer and the second metal layer, the area of the overlapping region between the source electrode and the gate electrode keeps constant,
   wherein the source electrode comprises an overlapping region with the gate electrode, and a first part region and a second part region located on the two sides of the gate electrode respectively in a direction parallel to a gate line;
   when dislocation occurs between the first metal layer and the second metal layer, a bottom area of the first part region is increased while a bottom area of the second part region is decreased; or a bottom area of the first part region is decreased while a bottom area of the second part region is increased;
   an increased/decreased bottom area of the first part region equals to a decreased/increased bottom area of the second part region.

2. The array substrate according to claim 1, wherein a pattern consisted of the first part region, the second part region and the overlapping region with the gate electrode comprises a U-shaped pattern with an opening facing a direction parallel to the gate line and an L-shaped pattern coupled with the closed side of the U-shaped pattern and arranged laterally;
   wherein the first part region is located at a position on one side edge of the U-shaped pattern that extends out of the gate electrode or located at a position on the two side edges of the U-shaped pattern that extend out of the gate electrode, and the second part region is located at a position on the L-shaped pattern that extends out of the gate electrode.

3. The array substrate according to claim 2, further comprising a data line coupled with the drain electrode, wherein the minimum distance from the first part region and the second part region to the data line is no less than a given threshold that is in the range of 5 μm to 10 μm.

4. The array substrate according to claim 1, wherein a pattern consisted of the first part region, the second part region and the overlapping region between the source electrode and the gate electrode is an analogous ±-shaped pattern;
   wherein the first part region is located at a position on the first side and/or the second side of the ±-shaped pattern that extends out of the gate electrode in a first direction parallel to the gate line; and
   the second part region is located at a position on the first side and/or the second side of the ±-shaped pattern that extends out of the gate electrode in a second direction opposite to the first direction, wherein the first side and the second side are parallel with each other.

5. The array substrate according to claim 4, further comprising a data line coupled with the drain electrode, wherein the minimum distance from the first part region and the second part region to the data line is no less than a given threshold that is in the range of 5 μm to 10 μm.

6. The array substrate according to claim 1, further comprising a data line coupled with the drain electrode, wherein the minimum distance from the first part region and the second part region to the data line is no less than a given threshold that is in the range of 5 μm to 10 μm.

7. A display device, comprising the array substrate according to claim 1.

8. A method for manufacturing the array substrate according to claim 1, comprising:
   forming a gate electrode on a substrate, wherein the gate electrode is located on a first metal layer;
   forming a gate electrode insulating layer, which covers the gate electrode, on the substrate; and
   forming an active layer, and a source electrode and a drain electrode located on the active layer in turn on the gate electrode insulating layer, wherein the source electrode and the drain electrode are located on a second metal layer.

9. An array substrate comprising a thin film transistor, the thin film transistor comprises a source electrode, a gate electrode and a drain electrode, wherein the gate electrode is located on a first metal layer, and the source electrode and the drain electrode are located on a second metal layer, wherein:
   the shapes of the source electrode and the gate electrode are configured so that, when dislocation occurs between the first metal layer and the second metal layer, the area of the overlapping region between the source electrode and the gate electrode keeps constant,
   wherein the gate electrode comprises a first part region and a second part region that are separated from each other, and the source electrode comprises a third part region that overlaps with the first part region and a fourth part region that overlaps with the second part region;
   when dislocation occurs between the first metal layer and the second metal layer, a bottom area of the third part region is increased while a bottom area of the fourth part region is decreased; or a bottom area of the third part region is decreased while a bottom area of the fourth part region is increased;
   an increased/decreased bottom area of the third part region equals to a decreased/increased bottom area of the fourth part region.

10. The array substrate according to claim 9, wherein the pattern of the source electrode is an analogous inversed T-shaped pattern consisted of the third part region, the fourth part region and the area between the first part region and the second part region;

wherein the third part region is located at a position on the inversed T-shaped pattern that overlaps with the first part region in a first direction parallel to the gate line, and the fourth part region is located at a position on the inversed T-shaped pattern that overlaps with the second part region in a second direction opposite to the first direction.

11. A method for manufacturing the array substrate according to claim 9, comprising:

forming a gate electrode on a substrate, wherein the gate electrode is located on a first metal layer;

forming a gate electrode insulating layer, which covers the gate electrode, on the substrate; and forming an active layer, and a source electrode and a drain electrode located on the active layer in turn on the gate electrode insulating layer, wherein the source electrode and the drain electrode are located on a second metal layer.

12. A display device, comprising the array substrate according to claim 9.

\* \* \* \* \*